US007125583B2

(12) United States Patent
Andideh et al.

(10) Patent No.: US 7,125,583 B2
(45) Date of Patent: Oct. 24, 2006

(54) CHEMICAL VAPOR DEPOSITION CHAMBER PRE-DEPOSITION TREATMENT FOR IMPROVED CARBON DOPED OXIDE THICKNESS UNIFORMITY AND THROUGHPUT

(75) Inventors: Ebrahim Andideh, Portland, OR (US); Kevin L. Peterson, Hillsboro, OR (US); Jeff Bielefeld, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 10/154,897

(22) Filed: May 23, 2002

(65) Prior Publication Data

US 2003/0219546 A1 Nov. 27, 2003

(51) Int. Cl.
*C23C 16/40* (2006.01)
*H05H 1/24* (2006.01)
(52) U.S. Cl. ............... 427/255.31; 427/533; 427/579; 134/1.1; 134/22.1; 438/905
(58) Field of Classification Search .......... 427/255.31, 427/533, 576; 134/1.1, 22.1; 438/905
See application file for complete search history.

(56) References Cited

U.S. PATENT DOCUMENTS

| 5,454,903 | A | * | 10/1995 | Redeker et al. ............. 134/1.1 |
| 5,824,375 | A | * | 10/1998 | Gupta ........................ 427/569 |
| 6,316,063 | B1 | | 11/2001 | Andideh et al. |
| 6,346,489 | B1 | * | 2/2002 | Cohen et al. ............... 438/789 |
| 6,449,521 | B1 | * | 9/2002 | Gupta ........................ 700/121 |
| 6,482,754 | B1 | | 11/2002 | Andideh et al. |
| 6,486,061 | B1 | * | 11/2002 | Xia et al. .................... 438/680 |
| 6,610,362 | B1 | * | 8/2003 | Towle .................... 427/255.23 |
| 6,677,253 | B1 | | 1/2004 | Andideh et al. |
| 6,902,629 | B1 | * | 6/2005 | Zheng et al. ................ 134/31 |
| 7,014,887 | B1 | * | 3/2006 | Cohen et al. ............... 427/534 |

OTHER PUBLICATIONS

Andideh, et al., "Concentration Graded Carbon Doped Oxide," U.S. Appl. No. 09/943,874 filed Aug. 31, 2001. under Final Rejection.

* cited by examiner

*Primary Examiner*—Bret Chen
(74) *Attorney, Agent, or Firm*—Rahul D. Engineer

(57) ABSTRACT

A method for improving thickness uniformity and throughput of a carbon doped oxide deposition process is described. That method comprises removing pre-deposition steps in a deposition phase. Moreover, helium plasma is added to a pre-clean phase to eliminate the production of dummy wafers.

9 Claims, 4 Drawing Sheets

CHEMICAL VAPOR DEPOSITION CHAMBER PRE-DEPOSITION TREATMENT FOR IMPROVED CARBON DOPED OXIDE THICKNESS UNIFORMITY AND THROUGHPUT

FIELD OF THE INVENTION

The present invention pertains to the field of semiconductor processing. More particularly, the present invention relates to a method to improve wafer to wafer uniformity and throughput in carbon doped oxide film technology.

BACKGROUND OF THE INVENTION

Semiconductor devices include metal layers that are insulated from each other by dielectric layers. As device features shrink, reducing the distance between the metal layers and between metal lines on each layer increases capacitance. To address this problem, insulating materials that have a relatively low dielectric constant k are being used. Carbon doped oxide (CDO) is one such example of a dielectric film having a low k value.

CDO film is typically applied in a deposition process outlined in FIG. 1. The deposition process is typically performed within a reactor such as a chemical vapor deposition (CVD) apparatus or chamber. The deposition process begins with setting gas flows and time spacings of the gas flows in operation 110. The CVD chamber walls are cleaned in operation 112 using a first cleaning plasma. A second cleaning plasma is then struck in operation 114 to clean the CVD spindle which is used for mounting wafers. Next, the CVD chamber is purged of all gasses in operation 116. Operations 110, 112, 114, and 116 comprise a set of operations known as a pre-clean phase.

Following the pre-clean phase, gas flows, temperature, and time spacings are set in operation 120. Radio frequency (RF) power is applied in operation 122 for 20 seconds to energize the gas mixture set in operation 120 for deposition. The RF power applied in operation 122, however, is only at half power. Full RF power is not applied until operation 124. Similar to operation 122, operation 124 is performed for 20 seconds. CDO is then deposited on a wafer for 45 seconds in operation 126. Because operations 122 and 124 are performed prior to deposition in operation 126, they are known as pre-deposition operations. Finally, the CVD chamber is purged of all gasses in operation 128. Operations 120, 122, 124, 126, and 128 comprise a set of operations known as a deposition phase.

Following the deposition phase, gas flows and time spacings are again set in operation 130. The CVD chamber walls are cleaned in operation 132 using the first cleaning plasma. The second cleaning plasma is then applied in operation 134 to clean the CVD spindle which is used for mounting wafers. Next, the CVD chamber is purged of all gasses in operation 136. Operations 130, 132, 134, and 136 comprise a set of operations known as a post-clean phase.

If no other wafer is to be processed as determined in operation 140, the deposition process is terminated in operation 145. Otherwise, the process returns to the deposition phase.

One or two wafers (dummies) are typically run before the chamber reaches optimum conditions every time the CDO deposition process is initiated. Less than optimal chamber conditions result in poor dielectric thickness uniformity. As a result, dummy wafers are typically used for production. Therefore, a CDO deposition process that helps to eliminate dummy wafer processing and improve dielectric thickness uniformity and throughput is desired.

BRIEF DESCRIPTION OF THE DRAWINGS

The embodiments of the present invention are illustrated by way of example and not in the figures of the accompanying drawings, in which like references indicate similar elements and in which.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Figure 1:
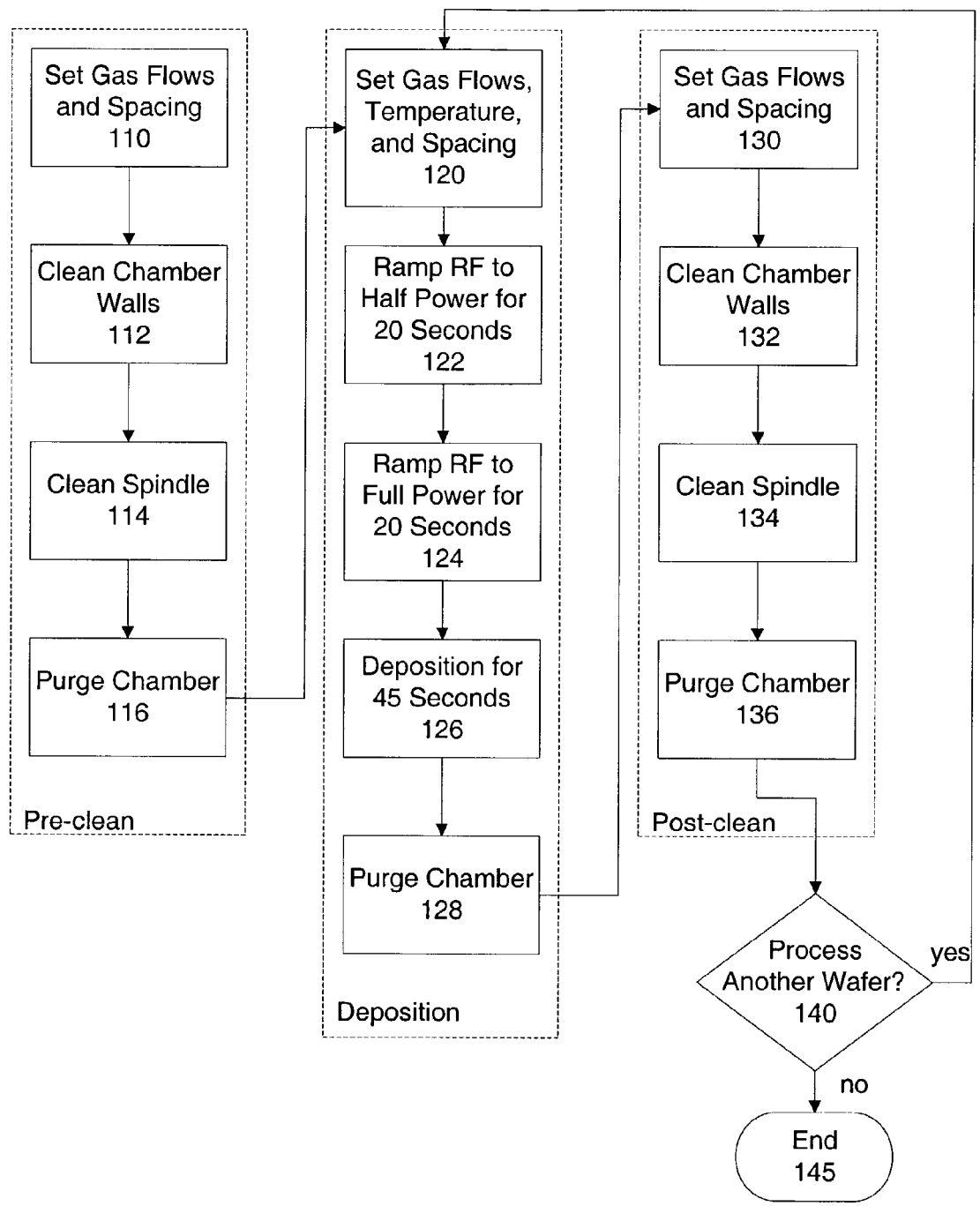
FIG. 1 shows a flowchart of a prior art carbon doped oxide deposition process.

For one embodiment of the invention, pre-deposition operations 122 and 124 of FIG. 1 are eliminated to improve processing throughput. As stated above, operations 122 and 124 take up approximately 20 seconds each. Thus, eliminating operations 122 and 124 reduces processing time by 40 seconds if the same dielectric quality can be achieved. Without pre-deposition operations 122 and 124, however, experiments show that the deposition time of operation 126 needs to be increased by approximately 20 seconds to achieve the same dielectric thickness.

Figure 2:
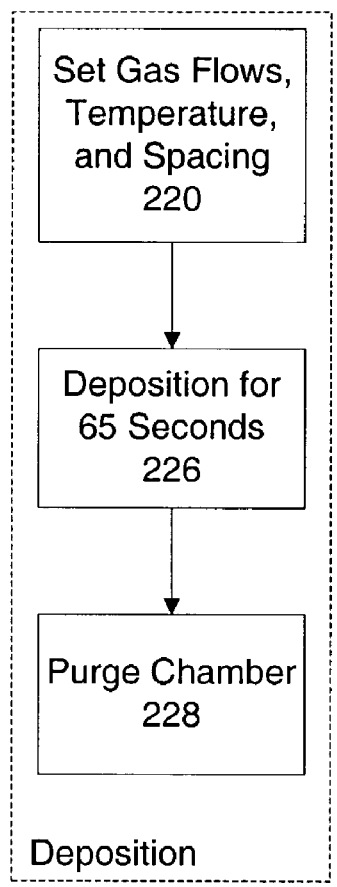
FIG. 2 shows one embodiment of deposition processing in accordance with the present invention that does not use pre-deposition to improve throughput.

FIG. 2 shows a modified deposition phase without the pre-deposition operations 122 and 124. In operation 220, the gas flows, temperature, and time spacings are set as was the case for operation 120 of FIG. 1. The wafer then undergoes a CDO deposition process in operation 226 for approximately 65 seconds. Instead of being ramped up prior to deposition as in operations 122 and 124, the RF power is turned on to full power during deposition. In other words, the RF power is set to a single predetermined power level without sustained intermediate power levels. The RF power may be set to the range of 200–4000 watts for full power depending on the CVD chamber configuration. The chamber is then purged of all gases in operation 228. The pre-clean and post-clean phases remain unchanged for this embodiment. Because approximately 40 seconds are saved by eliminating operations 122 and 124 and the new deposition operation 226 now requires an additional 20 seconds over the former deposition operation 126, each wafer achieves a total time gain of approximately 20 seconds per wafer.

Figure 3:
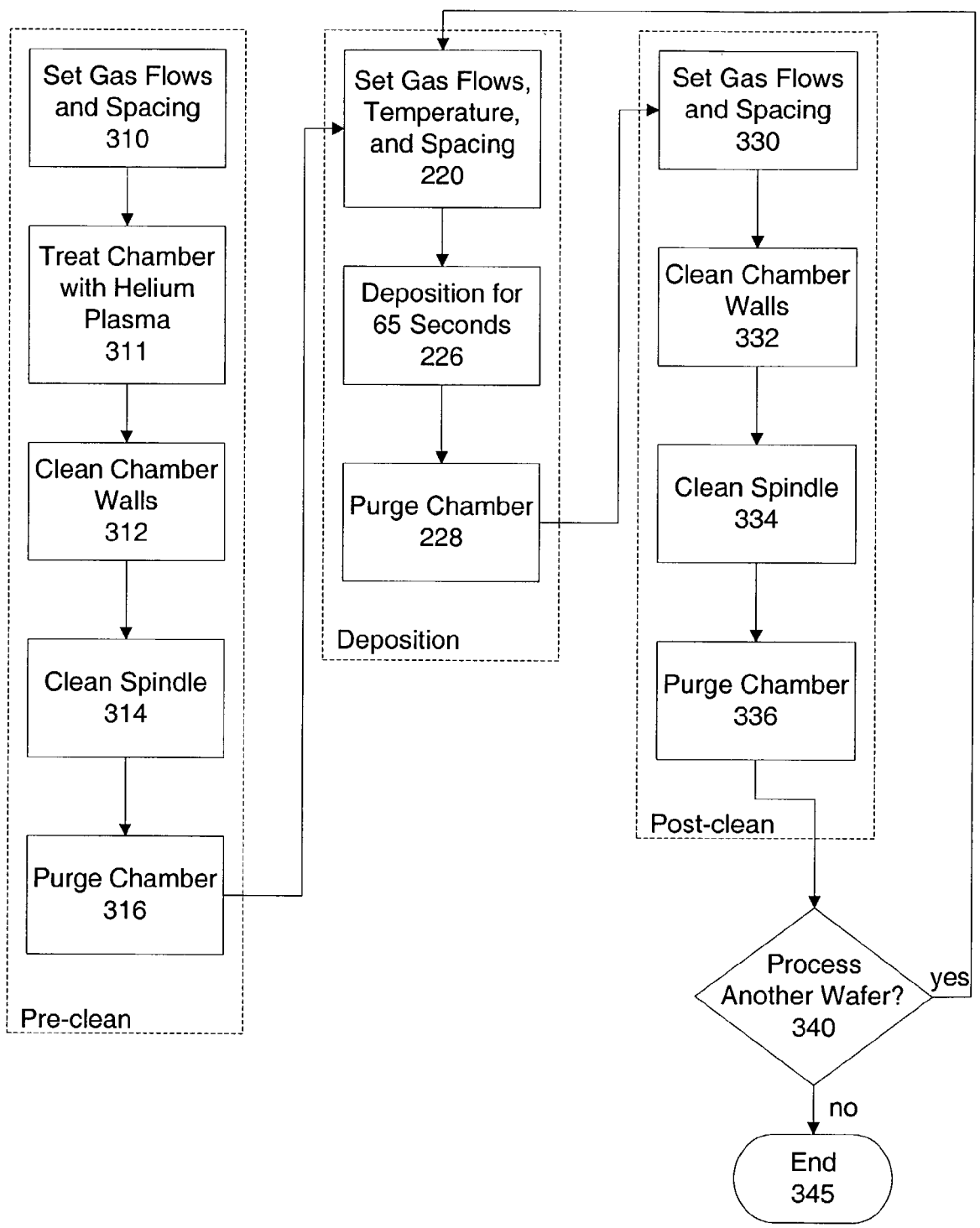
FIG. 3 shows another embodiment of the present invention for a carbon doped oxide deposition process to improve thickness uniformity and throughput.

For another embodiment of the invention, FIG. 3 combines the deposition phase of FIG. 2 with a modified pre-clean phase to help further improve throughput. The pre-clean phase of FIG. 3 comprises first setting the gas flows and time spacing in operation 310. A helium plasma is then applied to the CVD chamber in operation 311. Experiments have shown that the operation 311 helps to improve CDO thickness uniformity in the first two wafers after the CDO deposition process is initiated. The desired CDO thickness may range from 2000–20000 angstroms.

Figure 4:
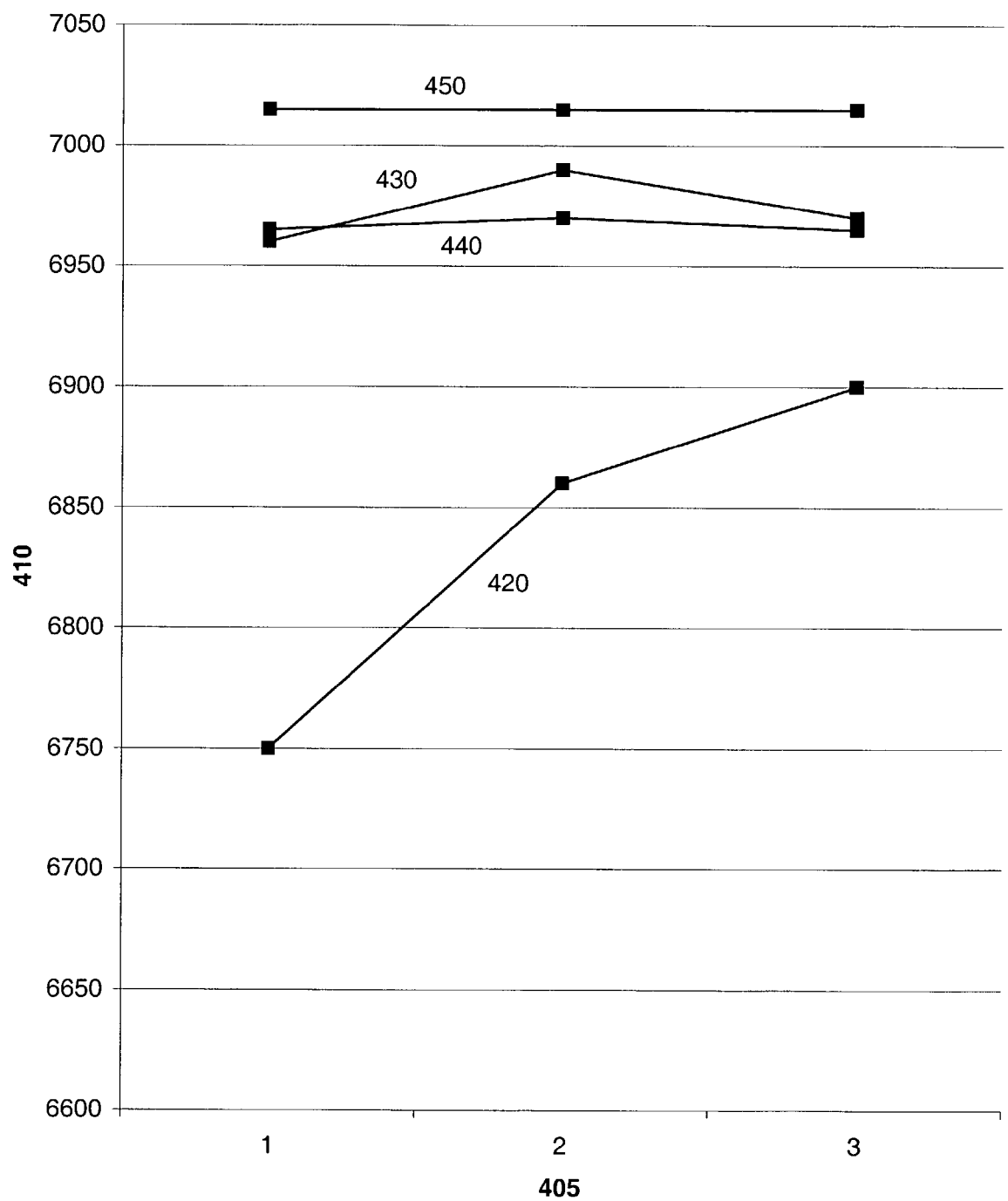
FIG. 4 shows a graph of carbon doped oxide thickness for a first, second, and third wafer as a function of the helium plasma application time.

FIG. 4 depicts a graph of CDO thickness on a first, second, and third wafer after the CDO deposition process is initiated. X-axis 405 represents the wafer being processed, while y-axis 410 represents the thickness of the wafer. Curve 420 shows a first, second, and third wafer where the chamber is not treated with a helium plasma. The first wafer has a CDO thickness of approximately 6750 angstroms. The second wafer has a CDO thickness of approximately 6860 angstroms. The third wafer has a CDO thickness of approximately 6900 angstroms.

In contrast, curves 430, 440, and 450 shows wafers where the chamber is first treated with a helium plasma in operation 311 for periods of one minute, two minutes, and three minutes respectively during the pre-clean phase. Each of curves 430, 440 and 450 are more linear than curve 420 with respect to the first, second, and third wafers. In other words, there is less variation between the thickness of the first wafer and the second wafer of each deposition run of each of curves 430, 440 and 450 than curve 420. Moreover, there is little variation between the thickness of the second wafer and the third wafer of each deposition run of curves 430, 440, and 450. With minimal variations between wafers, no dummy wafers are needed. This saves considerable time that more than makes up for the helium conditioning.

Choosing whether to apply a helium plasma for one, two, or three minutes in operation 311 involves a tradeoff between efficiency and quality. On the one hand, reducing the helium plasma application time increases throughput. On the other hand, increasing the helium plasma application time decreases variation in thickness uniformity.

The CVD chamber walls are cleaned in operation 312 using a first cleaning plasma after the helium plasma treatment of operation 311. A second cleaning plasma is then applied in operation 314 to clean the CVD spindle which is used for mounting wafers. Next, the CVD chamber is purged of all gasses in operation 316. Operations 312, 314, and 316 correspond to operations 112, 114, and 116 of FIG. 1.

Following the pre-clean phase, the deposition phase comprises setting gas flows, temperature and spacing in operation 220, depositing CDO for a period of approximately 65 seconds in operation 226, and purging the CVD chamber of gasses in operation 228. The post-clean phase comprises setting gas flows and time spacing in operation 330, cleaning the CVD chamber walls in operation 332, cleaning the spindle in operation 334, and purging the chamber in operation 336.

Operation 340 then determines if another wafer is to be processed. If additional wafers are to be processed, the CDO deposition process returns to the deposition phase. Otherwise, the process is terminated in operation 345.

In the foregoing specification the invention has been described with reference to specific exemplary embodiments thereof. It will, however, be evident that various modification and changes may be made thereto without departure from the broader spirit and scope of the invention as set forth in the appended claims. The specification and drawings are, accordingly, to be regarded in an illustrative rather than restrictive sense.

What is claimed is:

1. A method comprising:
    applying a helium plasma treatment to a CVD chamber that includes a chamber wall and a spindle;
    cleaning the chamber walls with a first cleaning plasma after the helium plasma application;
    cleaning the spindle with a second cleaning plasma after the helium plasma application; and
    depositing a carbon doped oxide (CDO) film in the CVD chamber.

2. The method of claim 1, further comprising: post-cleaning the CVD chamber.

3. The method of claim 1, wherein the helium plasma treatment is applied for greater than one minute.

4. The method of claim 1, wherein depositing a CDO film in the CVD chamber continues until the deposited CDO film is approximately 7000 angstroms thick.

5. A method comprising:
    preparing a chemical vapor deposition (CVD) chamber for carbon doped oxide deposition by treating the chamber with a helium plasma for greater than one minute;
    cleaning a chamber wall of the CVD chamber with a first cleaning plasma after the helium plasma application;
    cleaning a spindle of the CVD chamber with a second cleaning plasma after the helium plasma application; and
    setting a gas pressure in the CVD chamber.

6. The method of claim 5, further comprising: depositing a carbon doped oxide film.

7. The method of claim 5, wherein the chamber is treated with a helium plasma for between one minute and three minutes.

8. A method comprising:
    setting a first gas flow of a chemical vapor deposition chamber, wherein the chamber comprises a plurality of walls and a spindle;
    treating the chamber with helium plasma for approximately two minutes;
    cleaning the plurality of chamber walls with a first cleaning plasma after the helium plasma treatment;
    cleaning the spindle with a second cleaning plasma after the helium plasma treatment;
    purging the chamber;
    setting a second gas flow of the chemical vapor deposition chamber; and
    depositing a carbon doped oxide for approximately 65 seconds.

9. The method of claim 8, further comprising purging the chamber.

* * * * *